(12) United States Patent
Geneczko et al.

(10) Patent No.: US 7,491,938 B2
(45) Date of Patent: Feb. 17, 2009

(54) MULTI-SPECTRAL UNCOOLED MICROBOLOMETER DETECTORS

(75) Inventors: Jeannie Geneczko, Carlisle, MA (US); Richard Blackwell, Andover, MA (US); Margaret Kohin, Acton, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 111 days.

(21) Appl. No.: 10/589,525

(22) PCT Filed: Mar. 23, 2005

(86) PCT No.: PCT/US2005/009526

§ 371 (c)(1),
(2), (4) Date: Aug. 15, 2006

(87) PCT Pub. No.: WO2005/094460

PCT Pub. Date: Oct. 13, 2005

(65) Prior Publication Data

US 2007/0176104 A1 Aug. 2, 2007

Related U.S. Application Data

(60) Provisional application No. 60/555,469, filed on Mar. 23, 2004.

(51) Int. Cl.
*G01J 5/00* (2006.01)

(52) U.S. Cl. .............................. 250/339.02

(58) Field of Classification Search ............ None
See application file for complete search history.

(56) References Cited

U.S. PATENT DOCUMENTS

| | | | | |
|---|---|---|---|---|
| 5,286,976 A | * | 2/1994 | Cole | 250/349 |
| 5,572,060 A | | 11/1996 | Butler et al. | |
| 5,808,350 A | * | 9/1998 | Jack et al. | 257/440 |
| 5,811,815 A | * | 9/1998 | Marshall et al. | 250/370.06 |
| 5,900,799 A | | 5/1999 | Morris | |
| 6,121,618 A | | 9/2000 | Morris | |
| 6,201,243 B1 | | 3/2001 | Jerominek | |

(Continued)

FOREIGN PATENT DOCUMENTS

| | | |
|---|---|---|
| EP | 1 067 372 A1 | 1/2001 |
| WO | 00/33040 A1 | 6/2000 |
| WO | 00/33041 A1 | 6/2000 |

OTHER PUBLICATIONS

PCT Search Report dated Oct. 24, 2005 of PCT Application No. PCT/US2005/009526 filed Mar. 23, 2005, not a publication.

*Primary Examiner*—Constantine Hannaher
(74) *Attorney, Agent, or Firm*—Vern Maine & Associates

(57) ABSTRACT

A process and system for a medium wave infrared (MWIR) uncooled microbolometer focal plane array (FPA). One embodiment is for a single MWIR band uncooled IR detector, wherein the design and fabrication utilizes standard silicon processing techniques reducing manufacturing costs and preserving existing manufacturing capabilities. Another embodiment is a two color uncooled microbolometer IR detector providing broadband detection.

20 Claims, 13 Drawing Sheets

U.S. PATENT DOCUMENTS

| | | |
|---|---|---|
| 6,232,602 B1 | 5/2001 | Kerr |
| 6,373,055 B1 | 4/2002 | Kerr |
| 6,426,539 B1 | 7/2002 | Vilain et al. |
| 6,495,829 B1 * | 12/2002 | Oda ...................... 250/339.02 |
| 6,667,479 B2 | 12/2003 | Ray |
| 6,690,012 B1 | 2/2004 | Jacksen et al. |
| 2002/0030163 A1 | 3/2002 | Zhang |
| 2002/0175286 A1 | 11/2002 | Murguia |
| 2002/0179837 A1 | 12/2002 | Ray |
| 2002/0185600 A1 | 12/2002 | Kerr |

* cited by examiner

MULTI-SPECTRAL UNCOOLED MICROBOLOMETER DETECTORS

RELATED APPLICATIONS

This application is a National Phase Application of PCT Application No. PCT/US2005/009526, filed Mar. 23, 2005, which claims the benefit of U.S. Provisional Application No. 60/555,469, filed Mar. 23, 2004. Each of these applications is herein incorporated in its entirety by reference.

STATEMENT OF GOVERNMENT INTEREST

Portions of the present invention may have been made in conjunction with Government funding under Contract Number MDA972-00-C-0023, and there may be certain rights to the Government.

FIELD OF THE INVENTION

The invention relates to microbolometers, and more particularly, to microbolometer arrays for imaging applications.

BACKGROUND OF THE INVENTION

Thermal imaging cameras have been around for many years, wherein the sensitivity of the detectors to infrared (IR) radiation allows them to acquire images in darkness and through viewing obscurants such as dust and smoke. Thermal imagers designed primarily for the MWIR and LWIR spectral regions have provided a powerful tool for fire departments, emergency personnel and law enforcement agencies in addition to the military usage. For example, the Law Enforcement Thermographers Association recognizes eleven areas of usage, including search and rescue, fugitive searches, vehicle pursuits, flight safety, marine and ground surveillance, perimeter surveillance, officer safety, structure (building) profiles, disturbed surface scenarios (tracks), environmental law enforcement, and hidden compartments in vehicles.

Light absorption properties of the atmosphere define several frequency bands that are favorable to the transmission of light without undue absorption. Generally, these spectral ranges are defined as the visible band, the near infrared band, the short wave infrared (SWIR) band, the medium wave infrared (MWIR) band, and the long wave infrared (LWIR) band. The LWIR band is dominated by emitted light or thermal energy and spans roughly 8-14 μm with approximately 100% transmission in the 9-12 μm band, providing excellent visibility for most terrestrial objects. The MWIR band has both reflected and emitted radiation and spans about 3.3-5.0 μm allowing nearly 100% transmission with the additional benefit of lower ambient background noise. SWIR and near infrared (NIR) span the band from about 0.3-2.5 μm.

Infrared sensors are devices sensitive to radiation in a limited spectral range of infrared radiation, typically from one of the NIR, SWIR, MWIR or LWIR bands. Such sensors have been used for night vision applications for many years. The detector is essentially a transducer that converts IR energy into a measurable form. The detected energy can be transformed into imagery showing the differences between objects that might otherwise be obscured, wherein objects with differing levels of infrared emissions are discernable.

In general, there are two methods of infrared detection, namely energy detection and photon detection. Energy detection, sometime called thermal detectors, respond to temperature changes and have broad and generally uniform spectral responses with somewhat lower sensitivities and relatively slow response times. The thermal detectors can usually operate at or near room temperature. There a number of known energy detectors, including thermocouples/thermopiles, pyroelectric detectors, ferroelectric detectors, thermistors/bolometers/microbolometers and microcantilevers to name a few.

The photon detection or photodetectors generate free electrical carriers based on the incident infrared radiation and have more limited spectral responses, higher peak sensitivities, and relatively faster response times. The photon detection devices are ideal for fast scanning and imaging application while the uncooled energy detector devices are usually used for portable spot measurements. Other photon detectors include photovoltaic intrinsic detectors, photoconductive intrinsic detectors, extrinsic detectors, photo-emissive detectors, and quantum well photodetectors. There have also been attempts at two-color or dual-band photon detector arrays. These dual-band arrays can provide simultaneous detection in two wavelength bands, but the trade-offs in the design process generally limit the capabilities.

The infrared photon detectors are typically based on semiconductor materials fabricated with the elements in chemical tables III-V, such as indium, gallium, arsenic, antimony; or based on the elements in tables II-VI such as mercury, cadmium and telluride; or with the table elements IV-VI such as lead, sulfer and selenide. There are a number of permutations/combinations, including the binary compounds GaAs, InSb, PbS, PbSe or others including InGaAs and HgCdTe.

In the state of the art there are infrared photon sensing technologies that use semiconductor materials such as HgCdTe or InSb that require cooling in order to stabilize their infrared sensitivity while increasing the contrast of the acquired images. For example, one infrared device utilizes an LWIR sensor and a display screen to detect and display thermal energy. However, the LWIR sensor requires cryogenic cooling to maintain the sensor at stable conditions and high quantum efficiency. Detector cooling can be accomplished by thermoelectric Peltier cooling, compressed argon, liquid Nitrogen and Stirling-cycle cooling. The cooling adds substantial cost and bulk to the LWIR sensor, thus limiting the applications where cryogenically equipped LWIR sensors may be used. Thus, in general, the infrared sensors that generate signals based on photon absorption are relatively complex, costly, and not highly portable.

State of the art thermal imaging applications typically use uncooled thermal cameras that employ focal plane array (FPA) sensors. These FPA sensors use materials such as amorphous silicon, vanadium oxide (VOx) and barium strontium titanate (BST) to form thermal imager detectors. These FPA devices operate at or near room temperature, a characteristic that reduces system complexity, size, and cost. As the FPA sensors absorb incoming infrared radiation, they detect minute changes in resistance in the case of microbolometers made of VOx or amorphous silicon or changes in capacitance for the BST ferroelectric sensors rather than converting the electromagnetic radiation to electrons.

As known in the art, miniature or microminiature bolometers or microbolometers are used as detector pixel elements in two dimensional arrays of thermal infrared detectors. The two dimensional array of microbolometers converts the infrared energy arriving from a scene of interest into electrical signals that are applied to a readout integrated circuit (ROIC). After amplification and desired signal shaping and processing, the resulting signals can be further processed as desired to provide an image of the scene of interest.

A microbolometer typically includes a polycrystalline semiconductor material, such as vanadium oxide (VOx) or titanium oxide, having an electrical resistivity that varies as a function of temperature. An absorber of infrared, such as $Si_3N_4$, is provided in intimate contact with the polycrystalline semiconductor material so that its temperature can be changed as the amount of infrared energy arriving from the scene changes. Preferably, the polycrystalline semiconductor/absorber structure is thermally isolated from the underlying ROIC.

There are numerous design constraints that require tradeoffs in the design process for optimization for a particular application. During the design stage, the fabrication parameters are tailored for specific applications as the design choices affect the imaging properties. For example, automatic contrast and brightness controls minimize the need for user adjustments but sacrifice image optimization. The operating environment, the type of object under observation, the size, cost and quality desired are just some of the factors considered during the design stage.

One useful parameter for camera specifications is the noise equivalent temperature difference (NETD), which is a measure of the thermal sensitivity versus temporal noise. Certain uncooled cameras offer NETD values of approximately 100 mK or 0.1 degrees Celsius in the LWIR. While percent differences in NETD from one camera to another may seem significant, other factors contribute to image quality. The level of steady-state or fixed-pattern noise introduced by the detector can degrade image quality, making an imager inappropriate for a specific application, for example. Because this noise is fixed or slowly varying, it has a much greater adverse impact on the image than the transient noise indicated by the value of the NETD.

The modulation transfer function (MTF) serves as another metric for thermal imagers. Within the infrared sensor or detector, the MTF provides a measure of pixel-to-pixel isolation. At the camera level, the MTF also characterizes the quality of the optical system and gives an overall measure of image acuity. Thermal-imaging engineers even combine multiple parameters into a composite figure of merit known as minimum resolvable temperature difference (MRTD). The MRTD essentially measures the level of thermal contrast needed for an observer to distinguish alternating hot and cold bars in a test target. The MRTD is a function of the target spatial frequency (the width and spacing of the bars in the target).

Optics and lens selection is one of the many considerations for IR cameras. For example, the optical elements for MWIR systems tend to use silicon, while LWIR systems generally require germanium. The material choice depends upon many factors including transmission and dispersion. For example, with the appropriate spectral coatings applied to the optics, a single-element lens of silicon can provide about 98% transmission in the 3 to 5 µm range. Likewise, a single-element germanium lens has approximately 95% transmission in the 7 to 14 µm range.

In addition to considering component tradeoffs, engineers developing thermal imagers for law enforcement or military personnel also consider the systems-level design of the imaging units. For detectors in the MWIR and LWIR bands, shield glass lenses are sometimes used to minimize vulnerability to shock damage. The electronics also require protection from environmental conditions such as water and dirt that affects the absorption properties and generally requires structural considerations to minimize apertures and points of entry.

With respect to microbolometers, there are numerous documents describing the state of the art and techniques for fabrication. The fabrication techniques for LWIR microbolometers are well known in the art. There are numerous other texts and patents that depict LWIR microbolometer fabrication processes and variations, as is known to those skilled in the art.

While there have been a number of advancements in the field, the state of the art suffers from a number of disadvantages. The manufacturing processes and end-products employing the uncooled microbolometer arrays are relatively difficult and expensive. There is a need for an uncooled MWIR detector that has not been met. Furthermore, multiple band devices are also need in certain applications. What is needed is an uncooled MWIR microbolometer device and preferably employing familiar processing techniques for manufacturing.

SUMMARY OF THE INVENTION

The invention relates to infrared detectors, and more particularly, to uncooled microbolometers. One embodiment of the present invention provides the process and system for an uncooled MWIR microbolometer focal plane array thereby providing for the detection of MWIR radiation with high sensitivity without cooling.

The present invention also provides dualband and/or broadband coverage with a single microbridge. This would allow detection of two and three colors on a single chip by a single microbridge.

A further aspect of the present invention is selectively programmable array of pixels wherein each pixel is fabricated for a particular band and the system selects which band to detect. Thus, dualband and broadband coverage is enabled by an array of the present invention whereby the array is easily produced via a different mask pattern. For example, the MWIR absorber can be etched from certain pixels and other pixels can maintain the MWIR absorber thereby permitting multiple band coverage.

A further embodiment is for a single MWIR band uncooled IR detector structure, wherein simplicity in design and fabrication utilizing standard silicon processing techniques reduces manufacturing costs and preserves existing manufacturing capabilities. The LWIR processing techniques are well-established and are used in conjunction with the present invention to have MWIR devices.

Another embodiment is a two color uncooled IR detector thereby providing a broadband uncooled IR detector, and allowing for tunable IR wavelength detection.

Further embodiments of the present invention include the detection of MWIR or SWIR radiation with high sensitivity without cooling the detector, which adds significant value as cooling adds considerably to the design in cost and weight. The present invention also has embodiments that have two colors on the same chip, namely LWIR and MWIR, with broadband capability at room temperature with appropriate changes in optics, ROIC, and electronics. Other aspects include two colors on the same chip, namely SWIR and MWIR. Further embodiments include three colors on the same chip, namely LWIR, MWIR, and SWIR.

In addition, the present invention provides MWIR capability without modifying the ROIC or electronics used for the LWIR, therefore the MWIR capability is achieved with minimal fabrication changes to the LWIR resulting in production friendly processing. The designers are also able to pick and choose pixel colors and combinations by mask changes. Furthermore, improvements in LWIR uncooled technology can "trickle down" to MWIR processing permitting greater flexibility and utilizing improvements in the LWIR knowledge base to enhance MWIR performance.

One of the features of the invention is that it now allows IR imaging in the MWIR without cooling. There are numerous applications for such MWIR imaging heretofore not available, such applications include threat and missile warning, and long range imaging in high humidity environments. Improvements to the LWIR microbolometer technology are incorporated into the MWIR design thereby enhancing the MWIR imagery.

One aspect of the invention is a multi-band infrared imaging device, comprising an uncooled microbolometer focal plane array with a plurality of pixels, each of the pixels having at least one structure layer, a detector layer and a medium wave absorber layer, and wherein each of the pixels simultaneously detects at least two IR bands. As described, the array is fabricated by LWIR processing. Furthermore, the bands can be selected from the group consisting of MWIR/LWIR, MWIR/SWIR, SWIR/LWIR, and SWIR/MWIR/LWIR. The structure layer provides structural support, isolation, and/or passivation for the other layers.

Another feature of the invention includes wherein the structure layer is selected from at least one of the group consisting of metal films, semiconductor films, and dielectrics. In addition, the medium wave absorber layer can be selected from at least one of the group consisting of metal films, semiconductor films, and dielectrics with high MW absorption.

An embodiment of the invention includes an optical stack for an uncooled microbolometer device, comprising a read out integrated circuit (ROIC) substrate, a reflector on a surface of the substrate, a plurality of layers fabricated by LWIR processing, wherein the plurality of layers include an MWIR absorber, a detector, and at least one structure layer providing support and/or isolation. There is a gap between the reflector and the plurality of layers. The stack is part of the uncooled microbolometer and detects at least medium wave radiation. The structure layer may be selected from at least one of the group consisting of metal films, semiconductor films, and dielectrics. In more detail, the structural layer comprises at least one silicon nitride layer at least one silicon dioxide layer. One variation includes wherein the stack further detects LWIR and/or SWIR.

An additional aspect includes wherein the detector is vanadium oxide (VOx) or amorphous silicon. The MWIR absorber may be selected from at least one member of the group consisting of metal films, semiconductor films, and dielectrics with high MW absorption. In more detail, the MWIR absorber can be chrome, titanium nitride (TiN) or titanium tungsten (TiW).

One embodiment of the invention is a multi-spectral infrared (IR) focal plane array, comprising an uncooled microbolometer detecting at least two infrared bands. The microbolometer comprises a generally planar read out integrated circuit substrate base, at least one generally planar microbridge disposed approximately parallel to the base and separated by a gap, wherein each the microbridge comprises a plurality of layers, the layers comprising at least one structural support layer, a detector layer, and selectively a medium wave absorber layer. Furthermore, the array is selectively programmable to at least one of the bands. In addition, the array may be processed by LWIR techniques. A plurality of the microbridges can form a two-dimensional array having at least one microbridge without the medium wave absorber layer. The multiple IR bands can be selected from the group consisting of SWIR/MWIR, SWIR/LWIR, MWIR/LWIR, and SWIR/MWIR/LWIR. Furthermore, each microbridge can be arranged in a pattern having at least one microbridge with the medium wave absorber and least one the microbridge without the medium wave absorber. The medium wave absorber can be selectively formed by a pattern etch. Yet a further variation is having the MWIR absorber on all the microbridges but having certain microbridges optimized for MWIR and other microbridges optimized for another band such as LWIR. The selective formation of the microbridges with and without the medium wave absorber is a simple pattern etch processing.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTIONS OF INVENTIONS

The methods and embodiments of the present invention disclosed herein enable implementations of: MWIR, MWIR/LWIR, SWIR, MWIR/SWIR, and even LWIR/MWIR/SWIR detection devices constructed according to LWIR processing methods. It should be readily appreciated that the embodiments presented herein represent merely a limited number of embodiments for illustrative purposes and the present invention is not limited therein. The present invention combines a number of features and attributes that contribute to the unexpected multi-spectral result of the uncooled microbolometer of the present invention. The terms broadband, multiband and multispectral are used interchangeably within the context of the invention to relate to the entire SWIR/MWIR/LWIR or a portion thereof.

Figure 1:
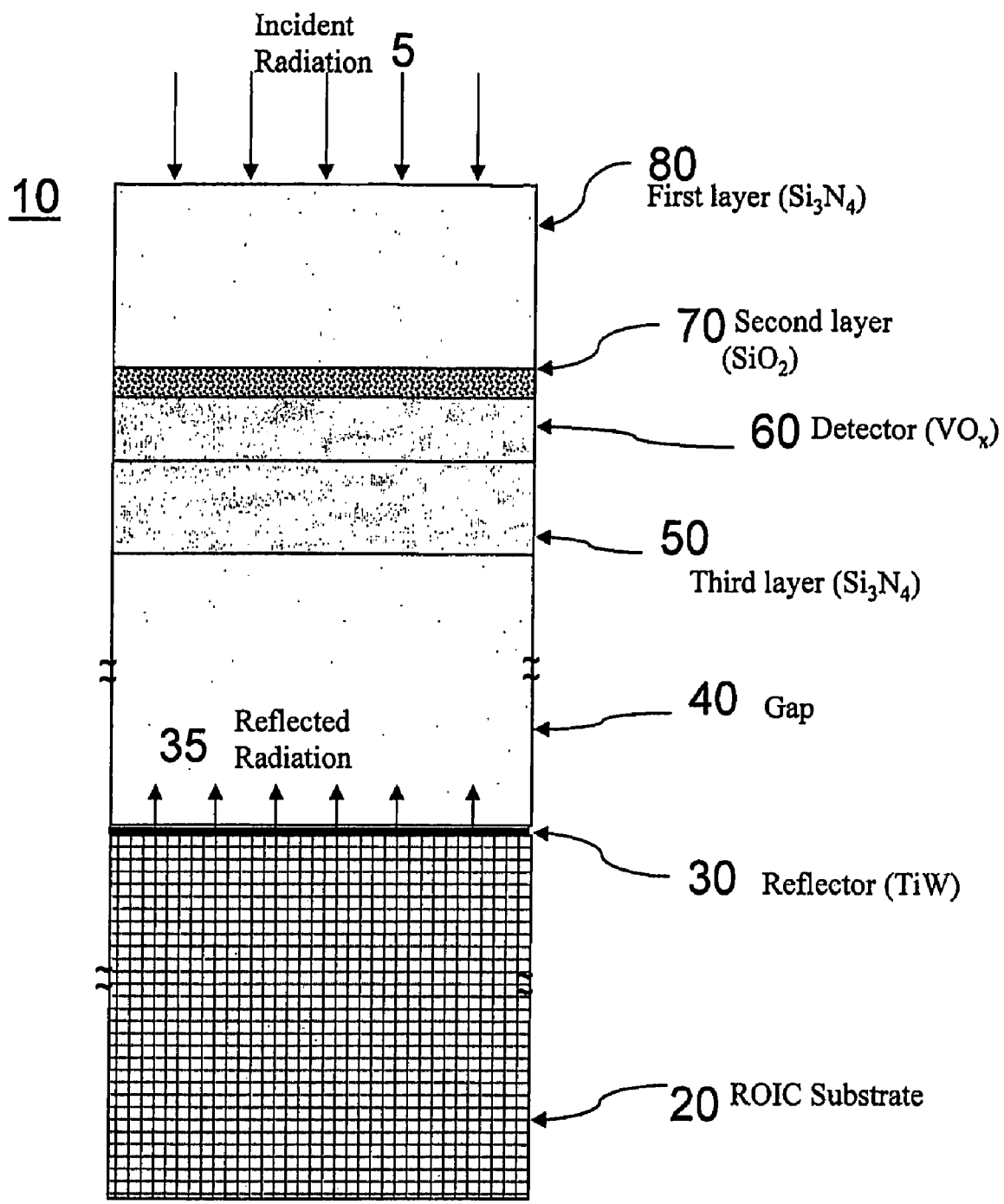
FIG. 1 is a prior art diagram illustrating a typical LWIR uncooled microbolometer stack.

The LWIR uncooled microbolometer is shown in FIG. 1. The fabrication of LWIR microbolometers is well known, wherein the various layers are designed for the specific need such as structural support, electrical connectivity, radiation reflection, absorption by the detector, and protection of the detector.

Referring to FIG. 1, the depicted embodiment shows the multi-layer stack 10 according to one LWIR configuration illustrating the incident radiation 5 upon the stack 10. The first layer 80 of the stack 10 helps to provides structural support and protection of the detector layer 60. The first layer 80 also aids electrical passivation so electrical contacts can be made to opposite ends of the detector. In one embodiment a dielectric such as silicon nitride ($Si_3N_4$) is used which provides the structural support and is also an LWIR absorber.

A second layer 70, such as $SiO_2$, is also used to facilitate fabrication and provide structural support and to protect the detector layer 60. The second layer 70 is typically designed with a thickness so as to be non-interfering with the sensitivity of the device. The silicon dioxide layer 70 provides the protection and isolation for the detector layer 60 and also is an LWIR absorber. While the first layer 80 and second layer 70 are LW absorbers, in the present implementation the primary purpose is for structure and protection. If the detector layer 60 did not require such support and protection, these layers 70, 80 would not be required.

The detector layer 60 of the stack 10 is the thermal detector layer and is vanadium oxide (VOx) in this embodiment. The VOx detector 60 has a high Temperature Coefficient of Resistivity (TCR), which refers to the rate of change of resistance in relation to temperature changes, and it responds to the heat from the absorbed infrared energy 5. There are various materials with differing temperature coefficients that may serve as the detector layer 60. This embodiment employs a third layer 50 composed of $Si_3N_4$ which provides further structural support and protection of the detector layer 60.

The stack 10 includes the Read Out Integrated Circuit (ROIC) substrate 20, typically a Silicon wafer or other suitable material. On top of the substrate 20 is the reflective layer 30 which can be a metallic layer or other suitable material and there is a gap 40 separating the reflective layer 30 from the rest of the layers of the stack 10. The gap 40 is typically formed from a sacrificial layer such as silicon dioxide and in this embodiment is 1.8 μm. The reflector 30 functions to reflect back any incident radiation for increased absorption efficiency by the stack. The gap 40 spacing can be selected according to the intended wavelength as is known in the art to further increase efficiency of the reflected radiation. For example, the gap 40 can be a thickness to obtain ¼ wavelength of the frequency of the radiation 5. The methods of forming the multi-layers of the stack 10 are well known and include processes such as sputtering, deposition, coating, etching, and photolithography techniques. The various layers above the gap are typically supported by vias (not shown) and electrically coupled by legs (not shown). The thickness of each layer is dependent upon a number of factors and can be derived using certain software programs, calculations or derived empirically.

The stack 10 of FIG. 1 is just one example of a baseline device for illustrative purposes and in this embodiment employs a ROIC substrate 20, a 0.1 μm TiW reflector 30, a 1.8 μm gap 40, a third layer of $Si_3N_4$ 50, a detector layer VOx 60, a second layer of $SiO_2$ 70, and a first layer of $Si_3N_4$ 80. In one design embodiment, the thicknesses of the multi-layer stack 10 includes a gap 40 (1.8 μm), $Si_3N_4$ 50 (0.15 μm), VOx 60 (0.06 μm), $SiO_2$ 70 (0.03 μm), and $Si_3N_4$ 80 (0.65 μm). Other LW designs and variations are known.

Figure 2:
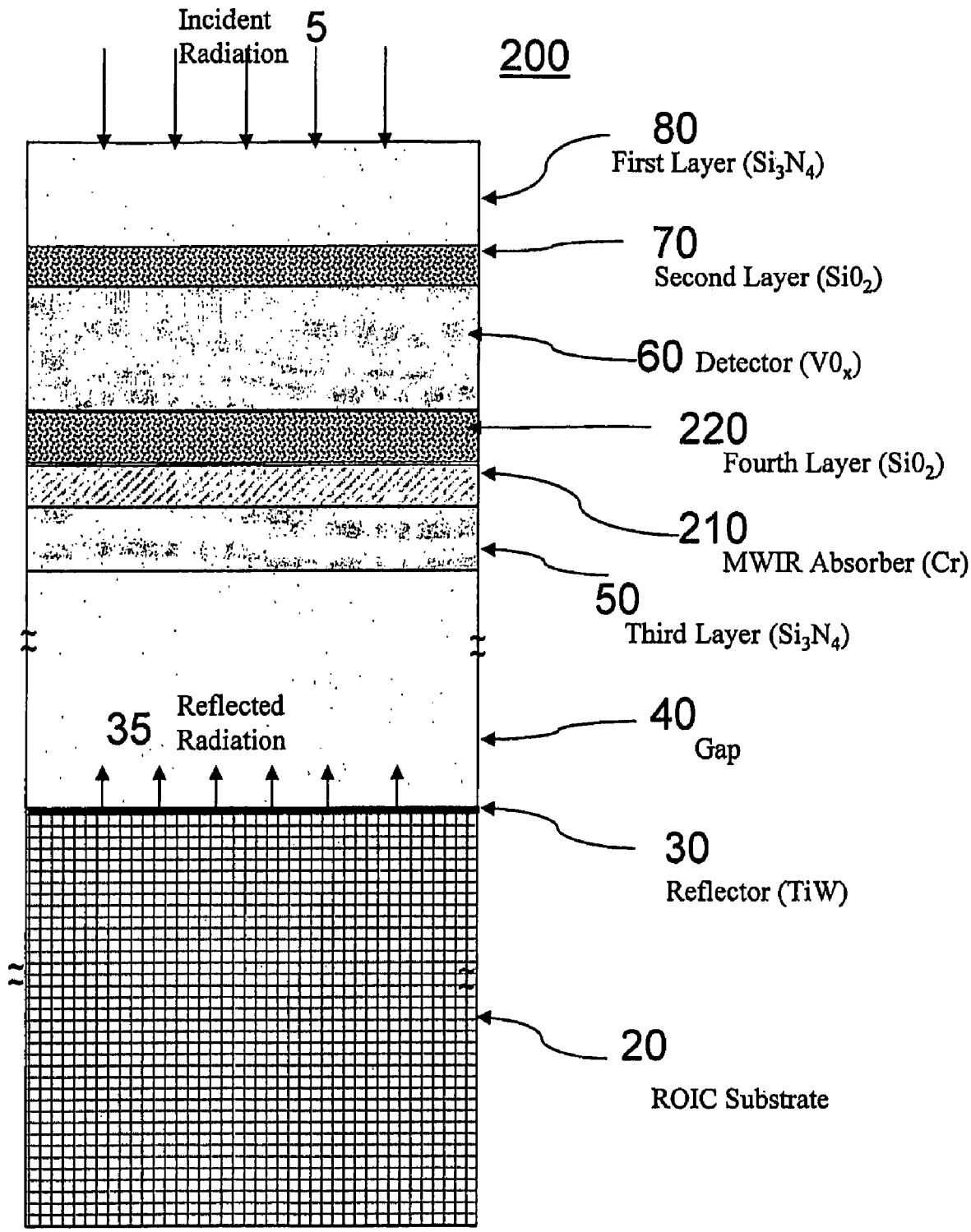
FIG. 2 is a diagram illustrating one embodiment for an LWIR uncooled microbolometer stack configured for high MWIR absorption.

FIG. 2 shows the modified stack 200 including the MWIR absorber 210 and an additional fourth layer 220 in-between, such as $SiO_2$. In a general form, one embodiment of the present invention uses LWIR microbolometer structures and technology but incorporates a high MWIR absorber 210, such as chrome, and possibly one or more layers for structural support, protection, isolation, and attachment purposes, such as the fourth layer 220. This allows the device to function in the MWIR range and also have multi-band capabilities.

The MWIR absorber 210 can be metal films, semiconductor films, and/or dielectrics with high absorption in the Reststrahl bands or band gap region to absorb radiation in the MW region. While many metals can be used, the fabrication adhesion is problematic with certain metals such as gold (Au) which requires an extra adhesion layer. The fabrication process is similar to the LWIR process, with the addition of including the MWIR absorber 210 and the fourth layer 220. While the device can be optimized for high MWIR detection, a multi-band device can also be achieved for coverage of the SWIR, LWIR and MWIR bands.

In one embodiment, the thicknesses of the multi-layer stack 200 includes a ROIC substrate 20, TiW reflector 30 (0.1 μm), gap 40 (1.3 μm), third layer $Si_3N_4$ 50 (0.1 μm), MWIR Cr Absorber 210 (0.0075 μm), fourth layer $SiO_2$ 220 (0.05 μm), Detector VOx 60 (0.12 μm), second layer $SiO_2$ 70 (0.03 μm), and first layer $Si_3N_4$ 80 (0.33 μm). Very thin chrome was used in this embodiment but other absorbers could be used as well for MW. For example, a very thin TiN could be used, as well as TiW, which are both metallic. It all depends on the absorber films response in the infrared, and the ability to incorporate that absorber in existing processes to build the device with the desired sensitivity. The support and structural layers such as the silicon nitride and silicon dioxide are examples of some of the common layers however other suitable materials are within the scope of the invention.

It should be readily apparent that the MWIR absorber film can be added above the detector or placed on both sides of the detector with or without support/isolation layers depending upon the specifics.

One of the early embodiments tested an LWIR baseline configuration and a modified baseline in order to compare the performance. The following table shows the baseline stack and the modified baseline for high MWIR absorption. As indicated in this example, the changes to the baseline stack include among others, adding a thin film metal absorber, changing the gap, and changing other film thicknesses to optimize for MWIR absorption while still having acceptable LWIR absorption. In a further embodiment, improved TNETD on the device for the LWIR was gained by making the device legs slightly wider.

TABLE A

Baseline LWIR and Modified Dualband Baseline

| STACK | Baseline LWIR | Dualband - MWIR & LWIR | |
|---|---|---|---|
| | | MWIR & LWIR | LWIR only |
| $Si_3N_4$ | 0.65 µm | 0.33 µm | 0.33 µm |
| $SiO_2$ | 0.03 µm | 0.03 µm | 0.03 µm |
| Detector (VOx) | 0.06 µm | 0.12 µm | 0.12 µm |
| $SiO_2$ | 0 | 0.05 µm | 0.05 µm |
| MWIR Absorber (Cr) | 0 | .0075 µm | 0 |
| $Si_3N_4$ | 0.15 µm | 0.1 µm | 0.1 µm |
| Gap | 1.8 µm | 1.3 µm | 1.3 µm |
| Reflector | 0.1 µm | 0.1 µm | 0.1 µm |
| ROIC Substrate | Infinite with respect to films | Infinite with respect to films | Infinite with respect to films |

The present invention teaches that the designer can modify the gap, material thicknesses, material composition, order of material sequence, number of layers and total stack thickness to optimize the sensitivity in MWIR and multiple wavelengths of interest by using the LWIR fabrication process to achieve MWIR, SWIR, MWIR/LWIR, MWIR/SWIR, and LWIR/MWIR/SWIR detection. In addition, the addition of the MWIR absorber layer, such as chrome, and proper tuning also improves LWIR. These dualband and triband devices are within the scope of the present invention according to the teachings herein.

Figure 3:
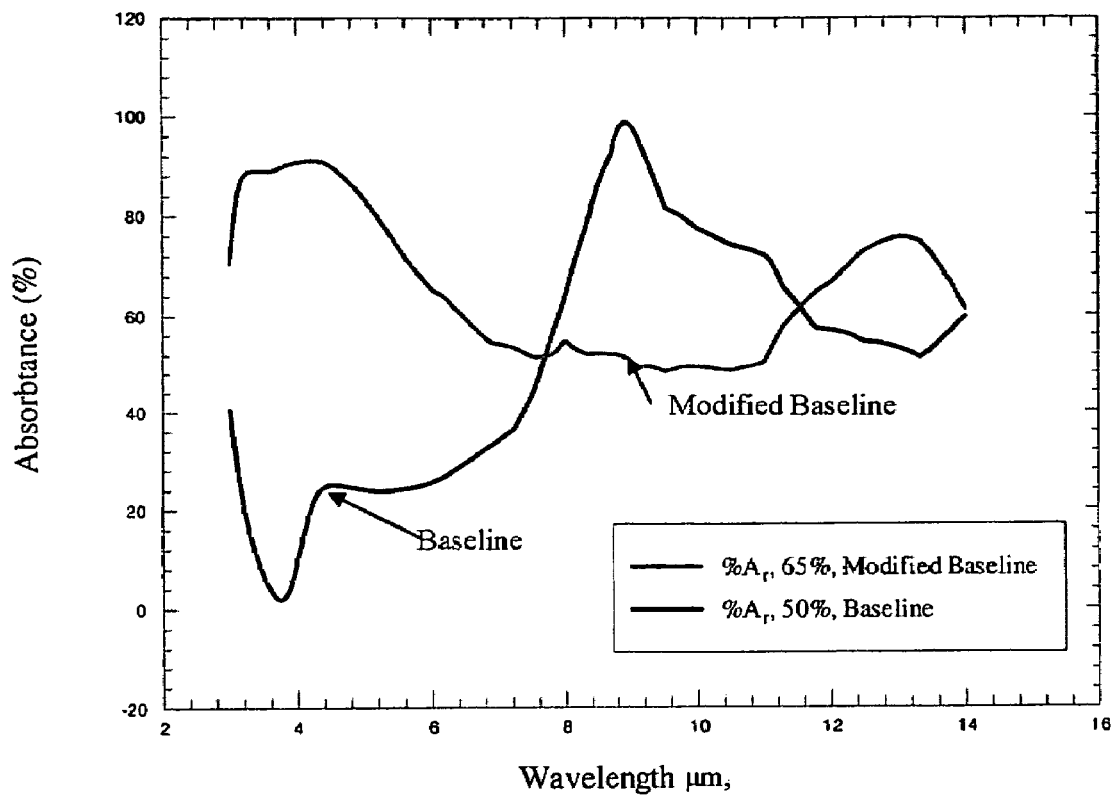
FIG. 3 is a graph showing absorbtance (%) versus wavelength (μm) comparing the LWIR baseline stack versus the modified absorber stack for high MWIR absorption from 3-14 μm.

Referring to FIG. 3, the absorbtance versus wavelength graph for the wavelength spectrum from 3 µm to 14 µm is displayed. The figure graphically illustrates that the Baseline LWIR stack noted in Table A is not sensitive in the MWIR band. For example, at 4 µm, the absorption is 0%, and for most of the range of 3-5.5 µm, the absorption is below 30%. No reasonable MWIR NETD can be expected from this baseline pixel stack.

Modifying the film stack dramatically affects the absorption characteristics as illustrated by the LWIR & MWIR Modified Baseline of Table A as depicted in FIG. 3. Using an optical film model to develop an alternative absorbing film stack sensitive in the MW, the production layer thicknesses were modified, the gap was resized to 1.3 µm, and an MWIR absorbing layer of very thin chrome was added. The resultant structure sandwich noted as the modified LWIR and MWIR baseline in Table A is compared to the baseline in FIG. 3. As expected, modifying the absorber stack changed the absorption characteristics significantly, and the MWIR absorption jumped to above 90% at 3-4 µm.

Figure 4:
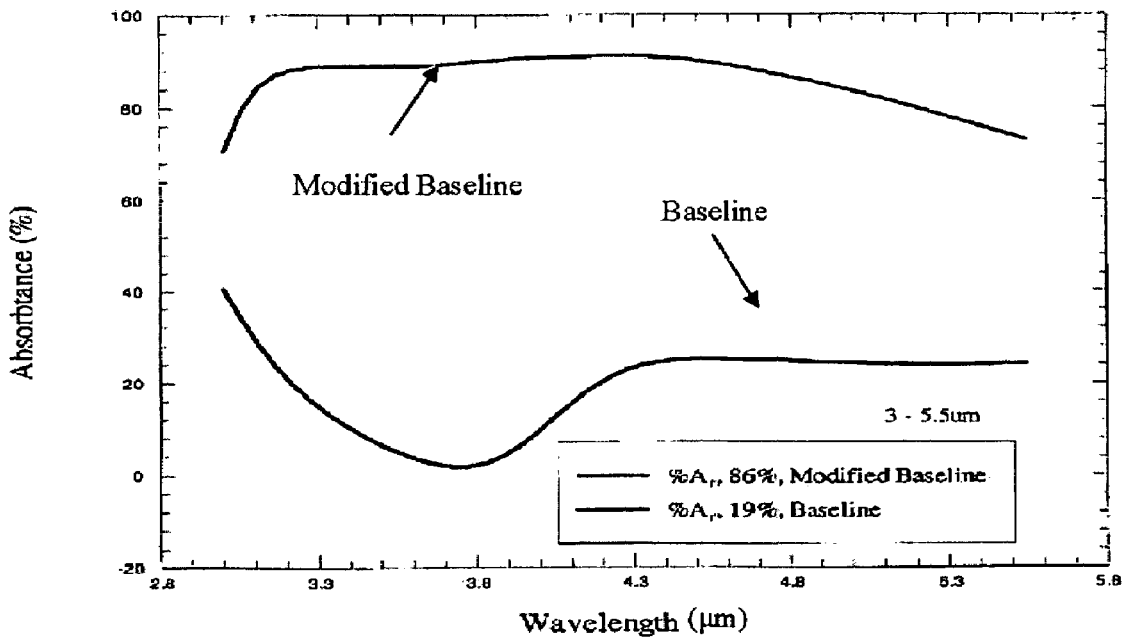
FIG. 4 is a graph showing absorbtance (%) versus wavelength (μm) comparing the LWIR baseline stack versus the modified absorber stack for high MWIR absorption focused on the 3-5 μm band.

Referring to FIG. 4, the curves of FIG. 3 are exploded in order to demonstrate the MWIR average absorption in the 3-5.5 µm band. As is clearly discernable, expanding the curves in the mid-wave region only, one can see that the average absorption in the 3-5.5 µm band has increased from 19% for the Baseline to 86% for the MWIR and LWIR Modified Baseline according to the recipe of Table A.

Figure 5:
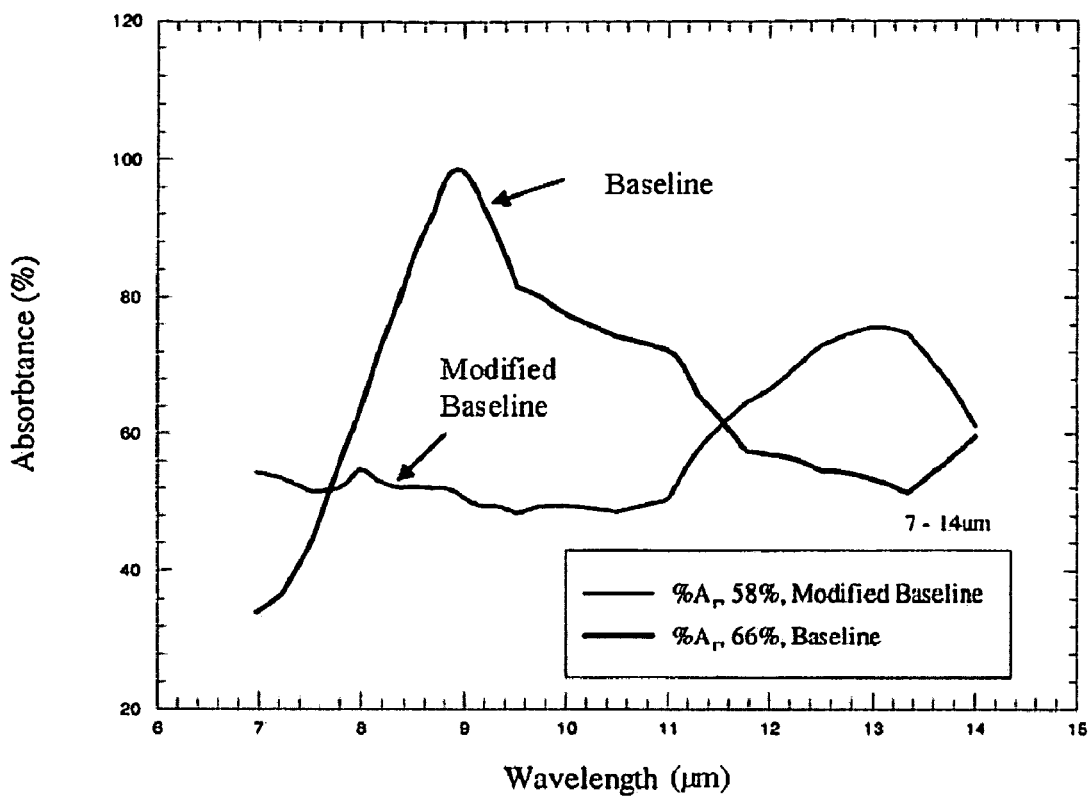
FIG. 5 is a graph showing absorbtance (%) versus wavelength (μm) comparing the LWIR baseline stack versus the modified absorber stack for high MWIR absorption focused on the 7-14 μm band.

FIG. 5 shows an exploded view of the 7-14 µm LWIR band of FIG. 3 in order to highlight the performance in this band for the Baseline stack as compared to the Modified Baseline MWIR and LWIR stack per Table A. Although the LWIR absorption has been reduced by the stack change, it still remains above 50% from 7 to 14 µm for a good TNETD and excellent imaging.

Figure 6:
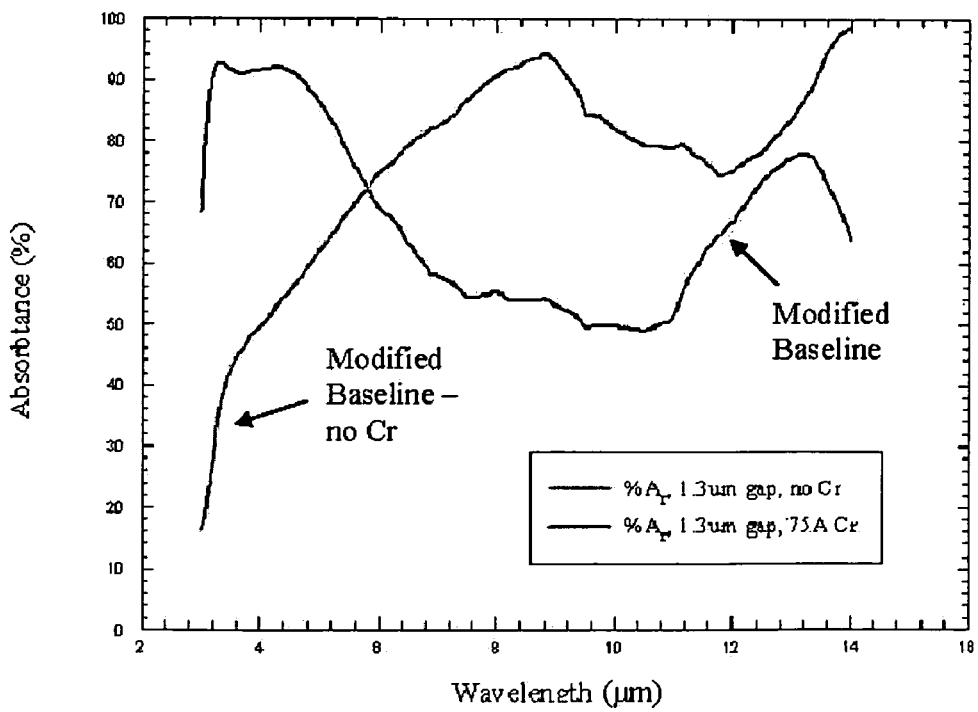
FIG. 6 is a graph showing absorbtance (%) versus wavelength (μm) comparing the modified absorber stack with the MWIR absorber versus the modified absorber stack without the MWIR absorber from 3-14 μm.

Referring to FIG. 6 this illustrates the performance for the dualband MWIR & LWIR stack with the MWIR Chrome absorber versus the same stack without the MWIR absorber, wherein the latter is termed LWIR only as noted in Table A. The chrome is etched off all pixels to obtain a better LWIR response as noted in the response curve. This dualband approach leads to multi-color devices.

The present invention cannot only design multi-band devices, but can establish two or more different colors optimized for each array. An optimized two color pixel array with MWIR and LWIR pixels can be implemented as noted in Table B showing the comparison in the pixel structure between the Baseline LWIR, and the two color pixel arrangement combining the MWIR pixels and the LWIR pixels.

TABLE B

Two Color Pixels on the Same Array

| STACK | Baseline LWIR | Two Color Pixels (Dual Band Pixels) MWIR or LWIR on Same Array | |
|---|---|---|---|
| | | MWIR | LWIR |
| Si3N4 | 0.65 µm | 0.175 µm | 0.175 µm |
| SiO2 | 0.03 µm | 0.03 µm | 0.03 µm |
| Detector VOx | 0.06 µm | 0.15 µm | 0.15 µm |
| SiO2 | 0 | 0.025 µm | 0.025 µm |
| MWIR Absorber (Cr) | 0 | 0.0075 µm | 0 |
| Si3N4 | 0.15 µm | 0.075 µm | 0.075 µm |
| Gap | 1.8 µm | 1.3 µm | 1.3 µm |
| Reflector (TiW) | 0.1 µm | 0.1 µm | 0.1 µm |
| ROIC Substrate | Infinite with respect to films | Infinite with respect to films | Infinite with respect to films |

Figure 7:
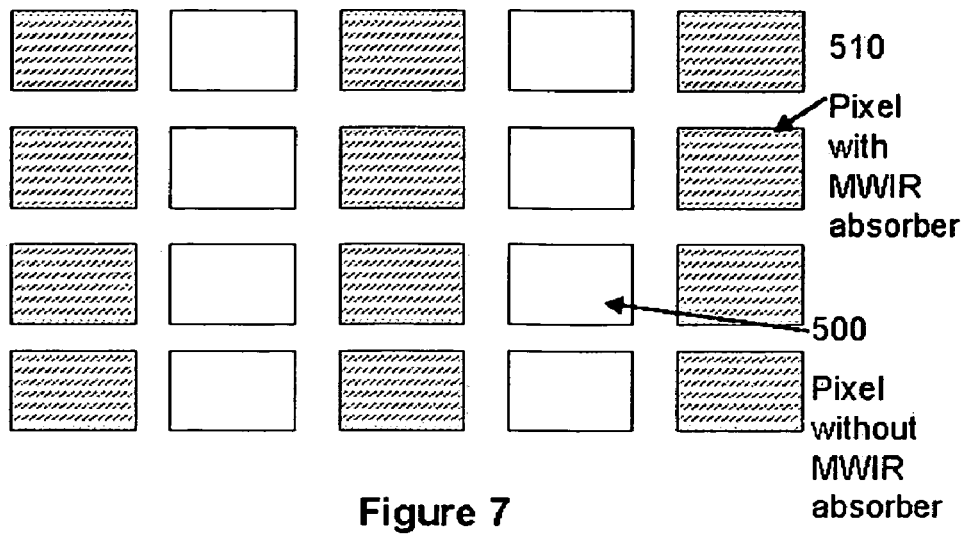
FIG. 7 illustrates a top perspective of a 4×5 array showing pixels with and without an MWIR absorber.

FIG. 7 is a top perspective view of a 4×5 array having two color pixels 500, 510. As detailed herein, the individual pixels can be fabricated with the MWIR absorber to enable MW band coverage. And, the MWIR absorber, such as chrome, can be selectively removed from the pixels thereby forming arrays having sets of pixels with the MWIR absorber 510 and without the MWIR absorber 500. Such a design optimizes sensitivity in the LW pixels. As is know in the art, the ROIC wafer processes the pixel information and thereby enables the device to operate as a two color device capable of measuring the incident radiation on the pixels of the array. Various patterns of the pixel arrangements can be designed via photolithography techniques for optimal performance based on design criteria. And, the combinational schema described herein can be extended to other pixel designs.

Figure 8:
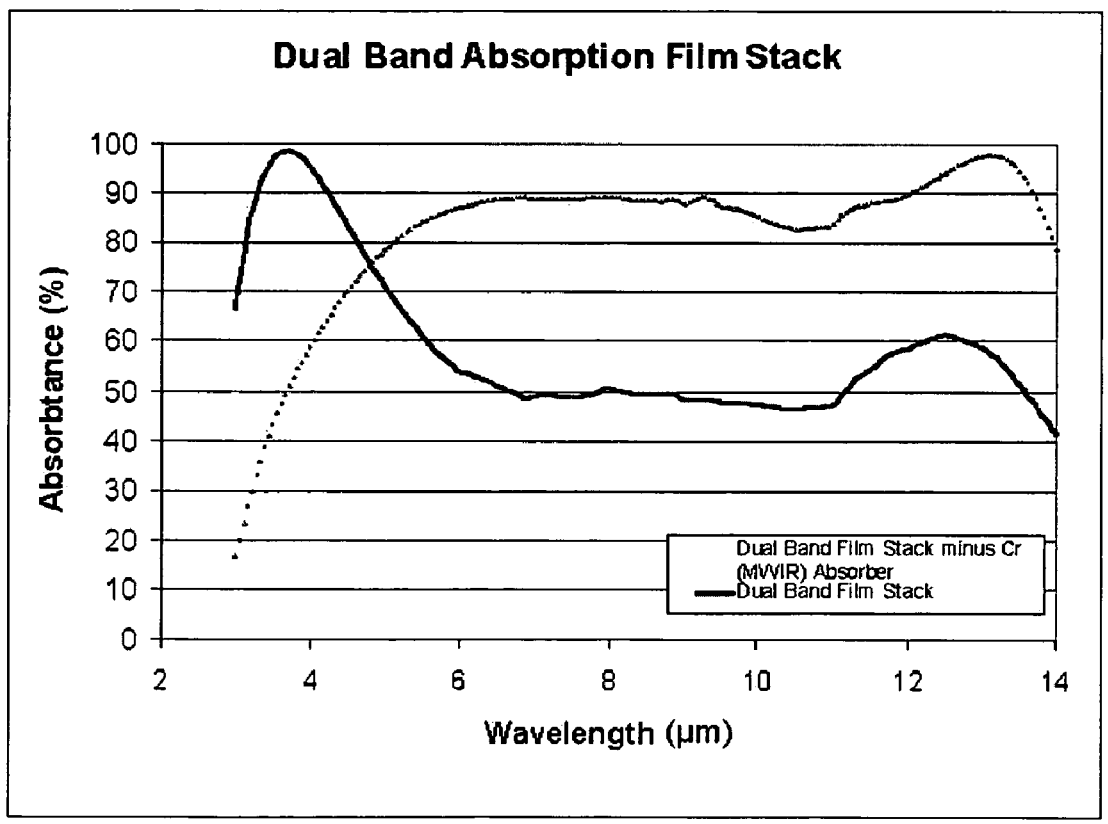
FIG. 8 is a graph showing absorbtance (%) versus wavelength (μm) comparing the dualband modified stack with the MWIR absorber versus the dualband modified stack without the MWIR absorber from 3-14 μm.

The absorbtance versus wavelength graph for the wavelength spectrum from 3 µm to 14 µm is displayed in FIG. 8 in relation to a dual band absorption film stack. The dual band modified film stack with the MWIR absorber is compared to the dual band modified film stack without the MWIR absorber and the resulting performance is displayed. As expected, the MWIR performance with the MWIR absorber is excellent and the MWIR performance without the MWIR absorber is poor. As designed, the LWIR performance without the MWIR absorber is also excellent.

Figure 9:
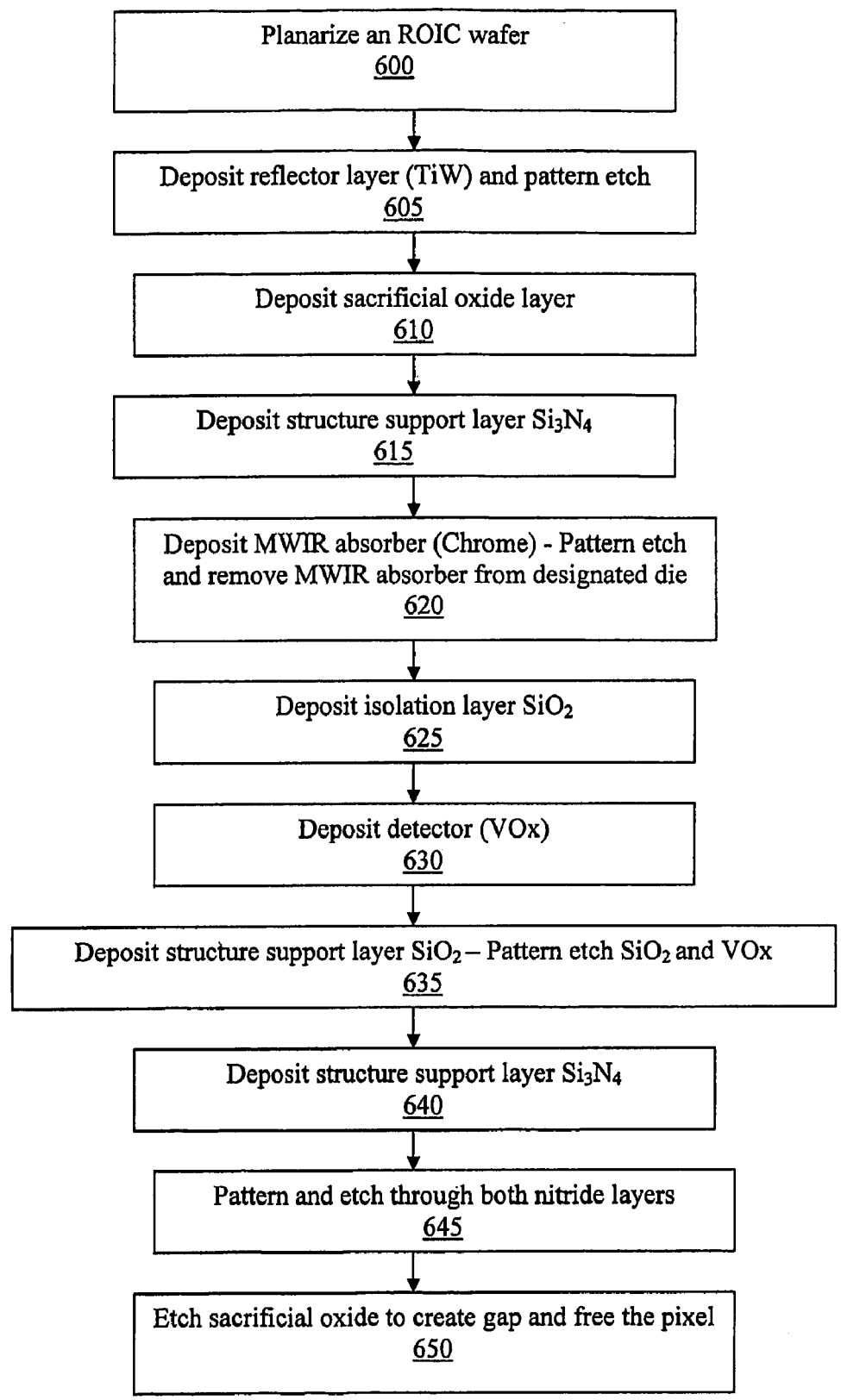
FIG. 9 is a flow chart of the processing steps for producing the MWIR device using steps familiar to the LWIR manufacturing.

Referring to the flowchart of FIG. 9, the processing steps for an embodiment related to the two color pixels is described. The processing commences with forming a substrate with supporting ROIC. The ROIC contains the electrical connectivity and drive circuitry required for the implementation and those skilled in the art are intimately familiar with the ROIC capabilities. The ROIC wafer surface typically has bumps and is generally non-uniform. In order to provide a smooth surface for further layers, the wafer is planarized to provide a smooth flat surface for the additional layers 600. A reflector layer is then deposited onto the planar wafer and a pattern is etched 605 using any of the known etching practices. In the illustrated embodiment the reflective layer is TiW, although other reflective materials may be utilized. A sacrificial oxide layer is deposited onto the reflector layer 610. The oxide layer will serve as the gap once it is removed. The present invention does not exclude other sacrificial layers such as polyimide.

As illustrated in the sectional perspectives of FIG. 1 and FIG. 2, the stack requires structural support in order to function, as it typically has several free-standing layers forming a microbridge with legs that couple those layers to the substrate. A support layer, such as $Si_3N_4$ is deposited on the oxide layer 615 to provide structure as well as protection of the detector. The MWIR absorber material is then deposited onto the support structure 620, and it should be understood that this detector also absorbs SWIR and LWIR. In the embodiment described herein, the MWIR absorber, such as chrome is the MWIR detection layer. The MWIR absorber is then pattern etched and the MWIR absorber is removed from certain designated pixels 620. In one embodiment the pixel detection is selective by changing absorbing pattern metal on any pixel. As shown in FIG. 7, the resulting array may have a plurality of pixels with an MWIR absorber as well as a plurality of pixels without an MWIR absorber.

Another structural support or isolation layer is then deposited onto the MWIR detector layer such as $SiO_2$ 625. The detector layer is than deposited onto this structural layer 630. The detector in this example is VOx and also absorbs LW, MW and SW radiation and it is the manner in which the stack is designed that determines the performance characteristics. Another support and protection layer is deposited onto the detector 635 which is $SiO_2$ in this example. The $SiO_2$ absorber layer and the VOx detector are then pattern etched.

A further support structure, such as $Si_3N_4$ is deposited on the SiO2 layer 640. Both the nitride layers are then subject to patterning and etching 645. The final step is to remove the sacrificial oxide layer 650 thereby forming a standing pixel that is operatively coupled by the legs to the ROIC substrate and supported by the vias (not shown).

The processing of FIG. 9 produces the two color pixel array. This processing is a variation of the LWIR processing, but adds the steps of depositing, etching and removing the MWIR absorber, depositing an additional $SiO_2$ layer and changing the sacrificial oxide thickness and nitride thicknesses.

Thus one embodiment involves multi color pixels providing multi-band operations and another implementation establishes a multi-band device but with all the pixels being substantially similar. A combinational MWIR/LWIR array on all pixels of the array would eliminate the step of removing the MWIR absorber from designated die so that all pixels would have essentially the same stack properties. With respect to the two color pixel variation, there are no additional processing steps between the dualband array and two color array, just a different photolithography mask.

Further embodiments of the present invention for broadband capability are within the scope of the invention. Table C illustrates one implementation of a broadband stack configuration as compared to a Baseline LWIR configuration.

TABLE C

Broadband Stack Configuration from SWIR-LWIR

| STACK | Baseline LWIR | BROADBAND SWIR to LWIR |
|---|---|---|
| Absorber ($Si_3N_4$) | 0.65 µm | 0.3 µm |
| $SiO_2$ | 0.03 µm | 0.03 µm |
| Detector (VOx) | 0.06 µm | 0.12 µm |
| $SiO_2$ | 0 | 0.025 µm |
| MWIR Absorber (Cr) | 0 | .0075 µm |
| $Si_3N_4$ | 0.15 µm | 0.1 µm |
| Gap | 1.8 µm | 1.1 µm |
| Reflector (TiW) | 0.1 µm | 0.1 µm |
| ROIC Substrate | Infinite with respect to films | Infinite with respect to films |

As described herein, the present invention allows multi-band responses depending upon the configuration of the stack. It is thus possible to use a single stack configuration according to the teachings of the present invention to adequately measure radiation from images in multiple bands.

Figure 10A:
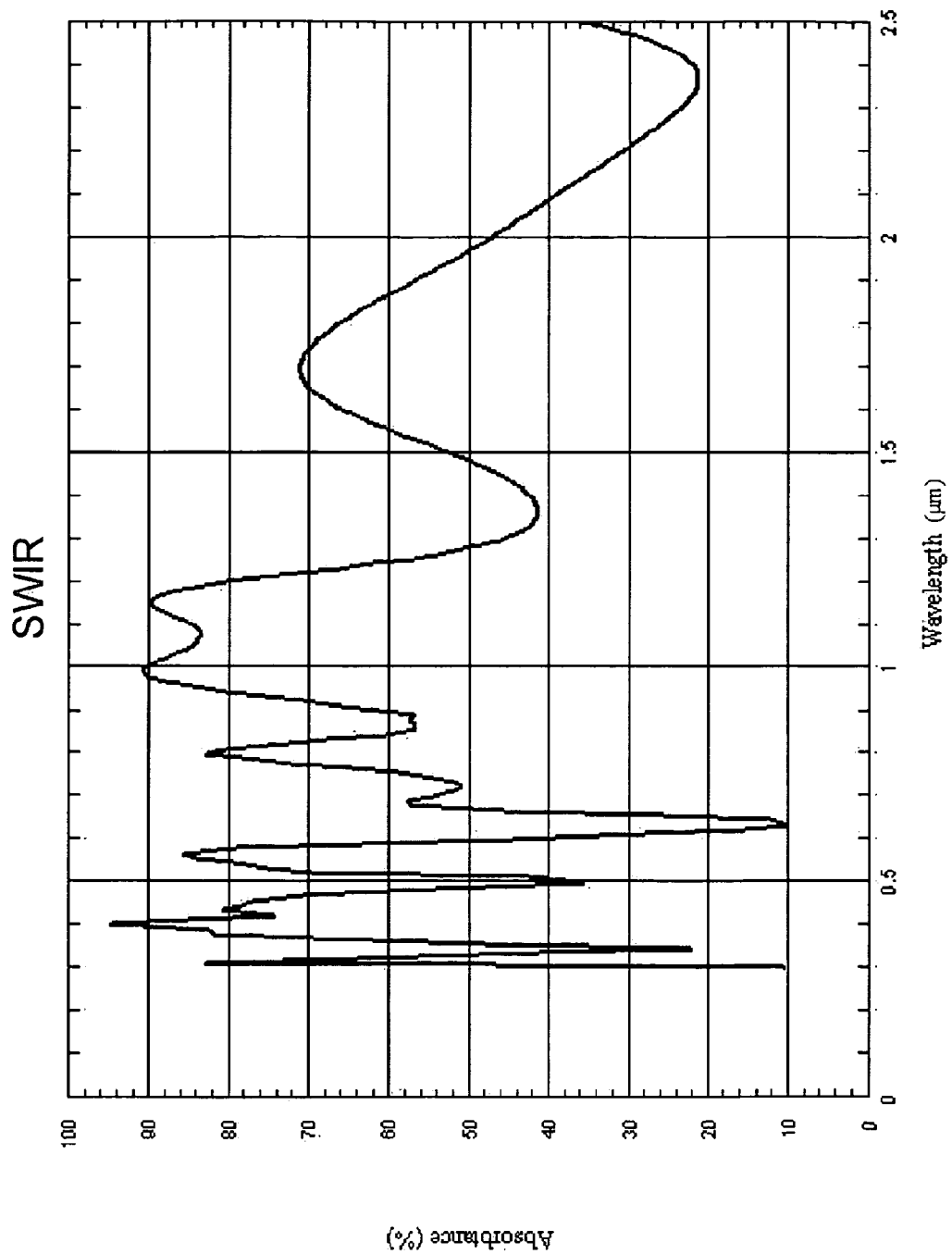
FIG. 10a is a graph showing absorbtance (%) versus wavelength (μm) of SWIR (0.3-2.5 μm) for a broadband stack configuration.
Figure 10B:
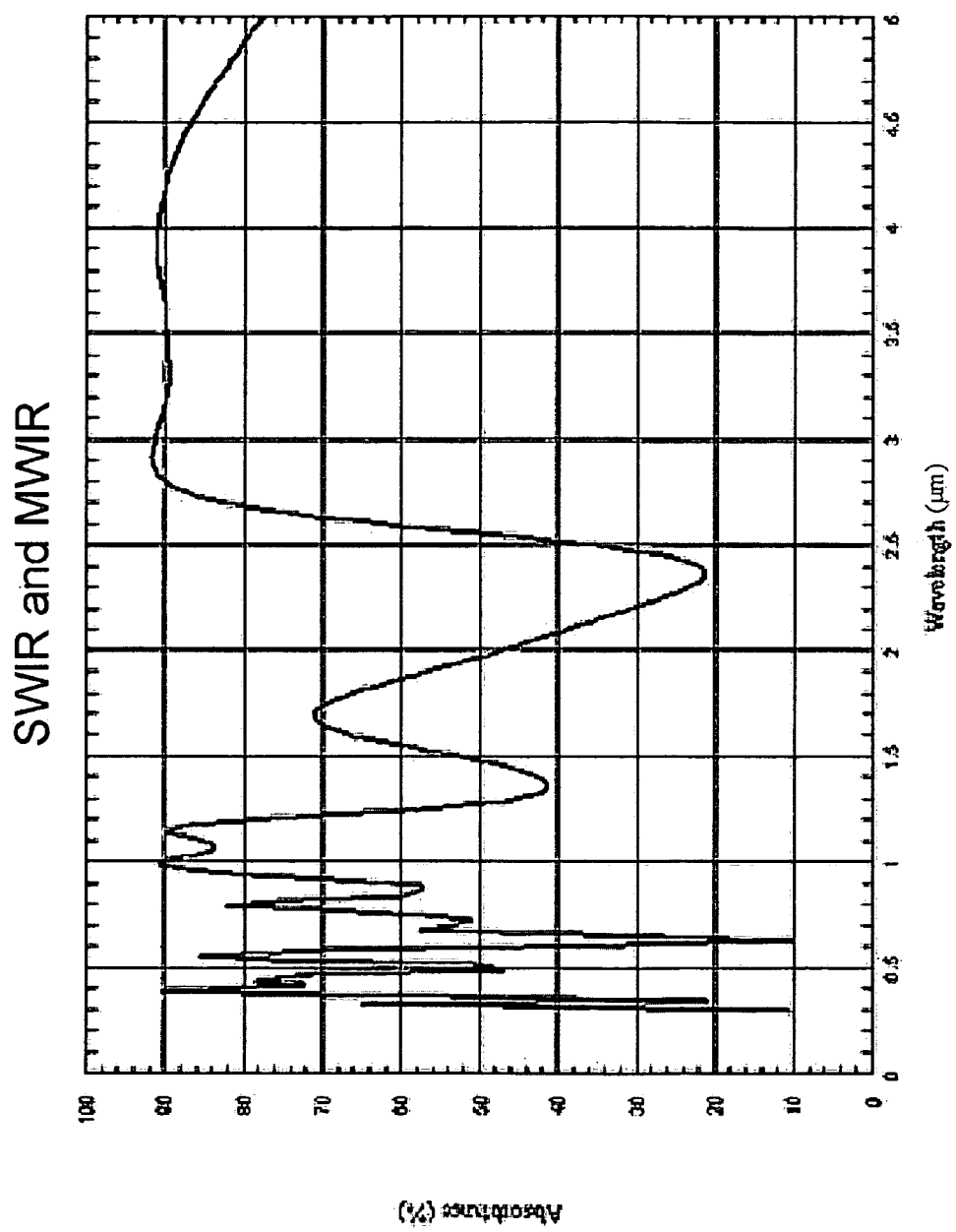
FIG. 10b is a graph showing absorbtance (%) versus wavelength (μm) of SWIR and MWIR (0.3-5 μm) for a broadband stack configuration.
Figure 10C:
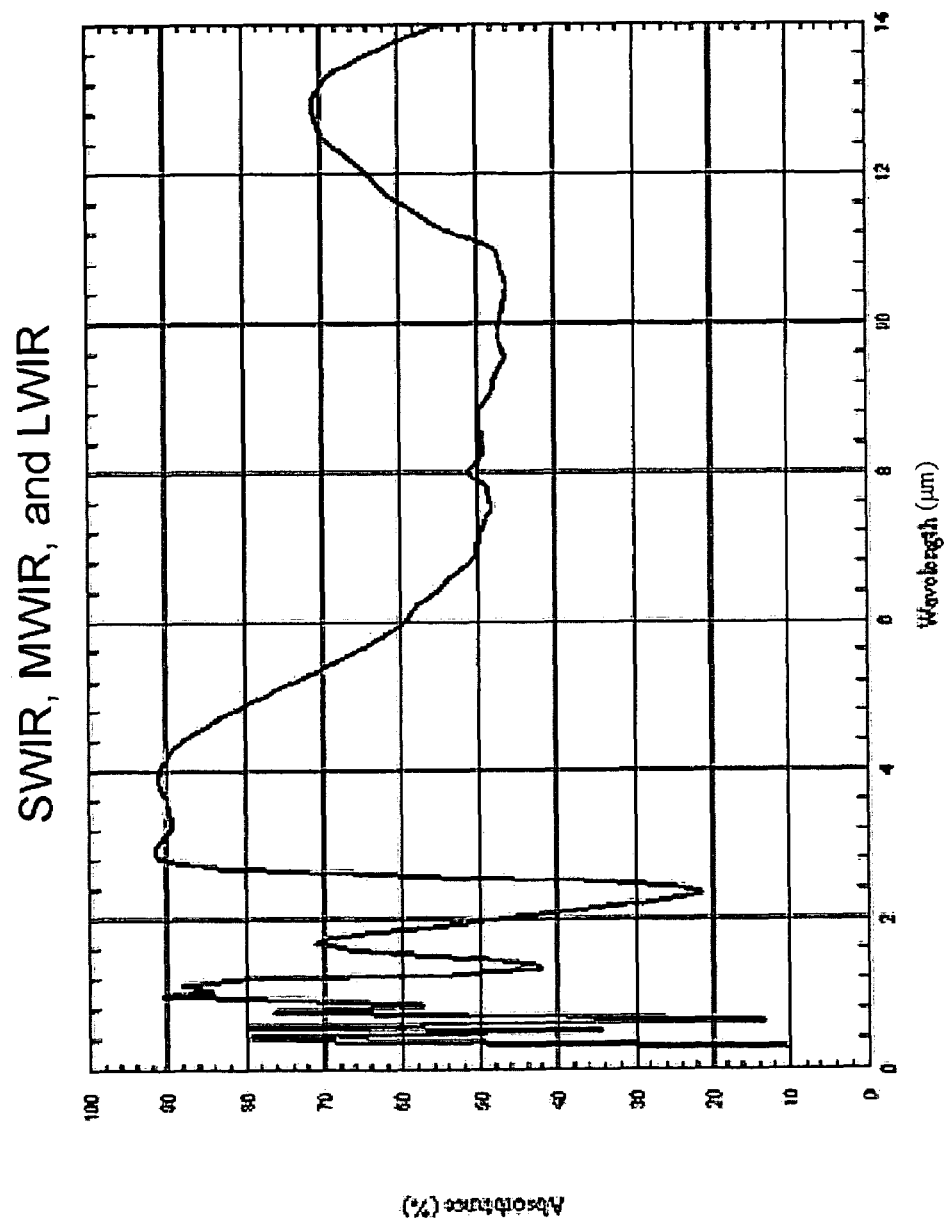
FIG. 10c is a graph showing absorbtance (%) versus wavelength (μm) of SWIR, MWIR and LWIR (0.3-14 μm) for a broadband stack configuration.
Figure 10D:
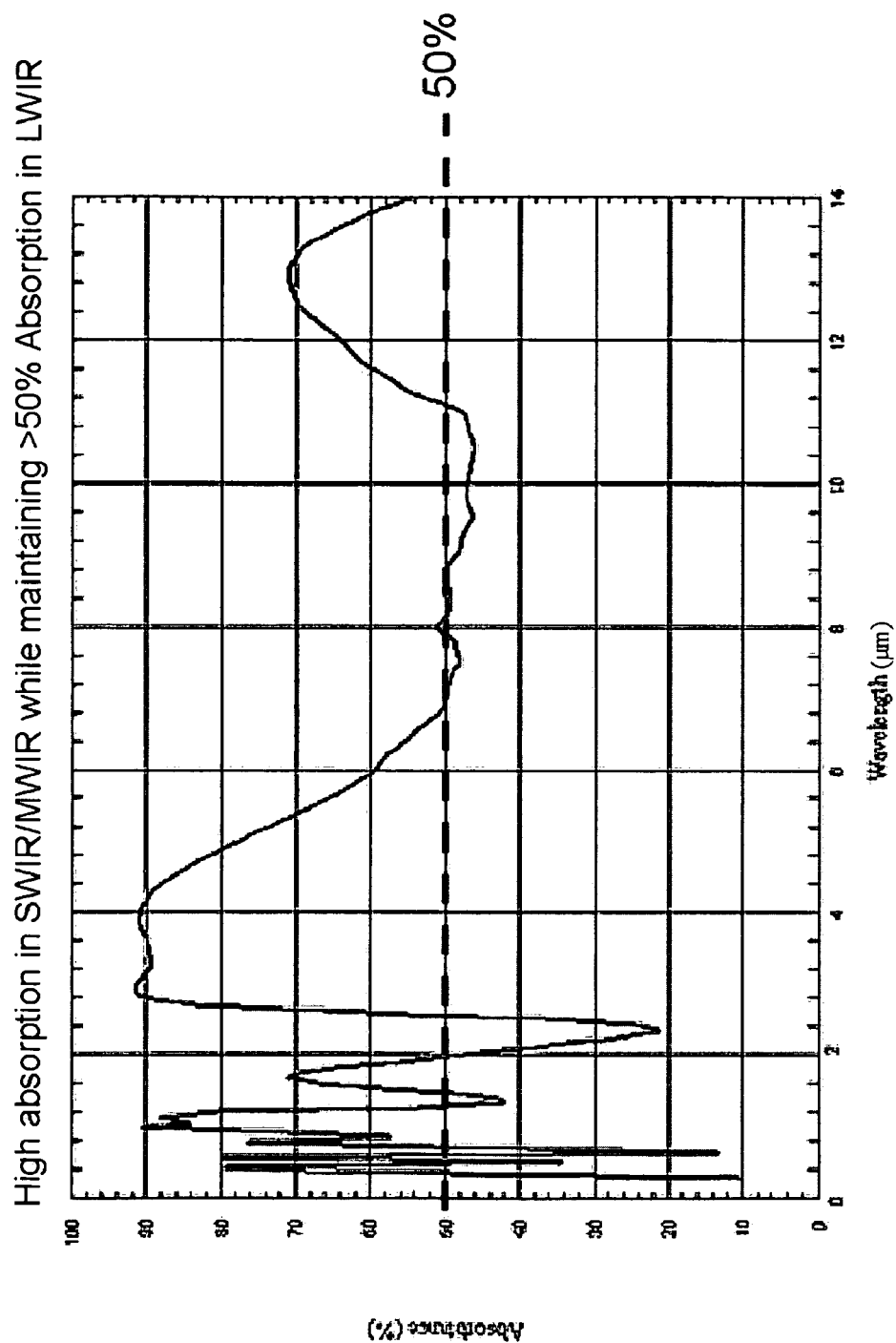
FIG. 10d is a graph showing absorbtance (%) versus wavelength (μm) of SWIR, MWIR and LWIR (0.3-14 μm) for a broadband stack configuration indicating the high absorption in SWIR/MWIR while maintaining greater than 50% absorption in LWIR.

FIG. 10a shows the SWIR absorbtance response from about 0.3 um to about 2.5 µm using the multi-band stack configuration of Table C. FIG. 10b displays the absorbtance characteristics in the SWIR and MWIR band for the same stack configuration. The absorbtance response curve of FIG. 10c shows the band coverage of SWIR, MWIR and LWIR. The exceptional multi-band performance is graphically shown in FIG. 10d wherein the high absorption of SWIR/MWIR is presented along with maintaining >50% absorption in LWIR.

Figure 11:
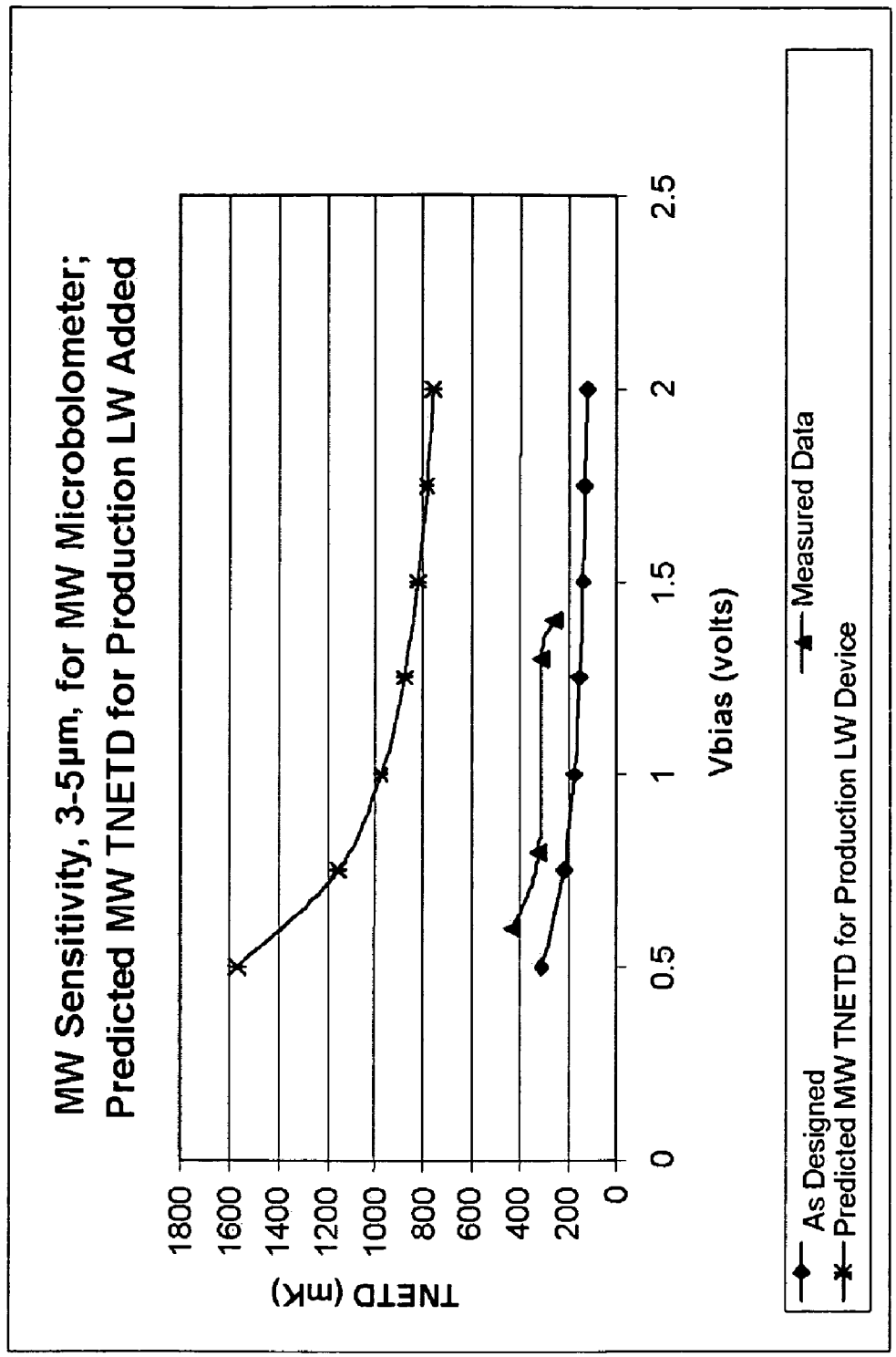
FIG. 11 is a graph depicting TNETD versus Vbias illustrating the sensitivity improvements for the MW microbolometer over a similar device not enhanced for MW absorption.

The present invention has been demonstrated as depicted in FIG. 11, wherein the MWIR performance is shown for the 46 µm pitch Baseline Array. Several perspectives of the MW-LW microbolometer performance is shown via the curves herein illustrating the MW Sensitivity for the baseline LW device, the predicted response and the actual response in the 3-5 um band. The uppermost curve represents the predicted MW sensitivity from the standard LW device using modeling systems. The lowest curve represents the predicted sensitivity of MW performance with the design modification. The middle curve shows the actual measured performance of the designed microbolometer device.

The predicted MW TNETD as shown by the uppermost curve goes from approximately 825 mK at 1.4 volts bias for the standard microbolometer versus the measured 261 mK at the same bias on the designed device shown by the middle curve. The 261 mK pixel did not match the predicted response however the processing was not optimized at that time and an improved measured response is expected with optimized processing. In a general sense, the smaller the TNETD, the better the performance.

One objective of the present invention was to develop the technologies and adapt current production processes in order to make a high performance MWIR microbolometer focal plane. There are a significant number of difficulties including issues with uncooled MWIR thermal detectors wherein the blackbody power contrast in the 3-5.5 μm spectral band is about ½ to ⅛ that in the 8-14 μm spectral band.

Figure 12:
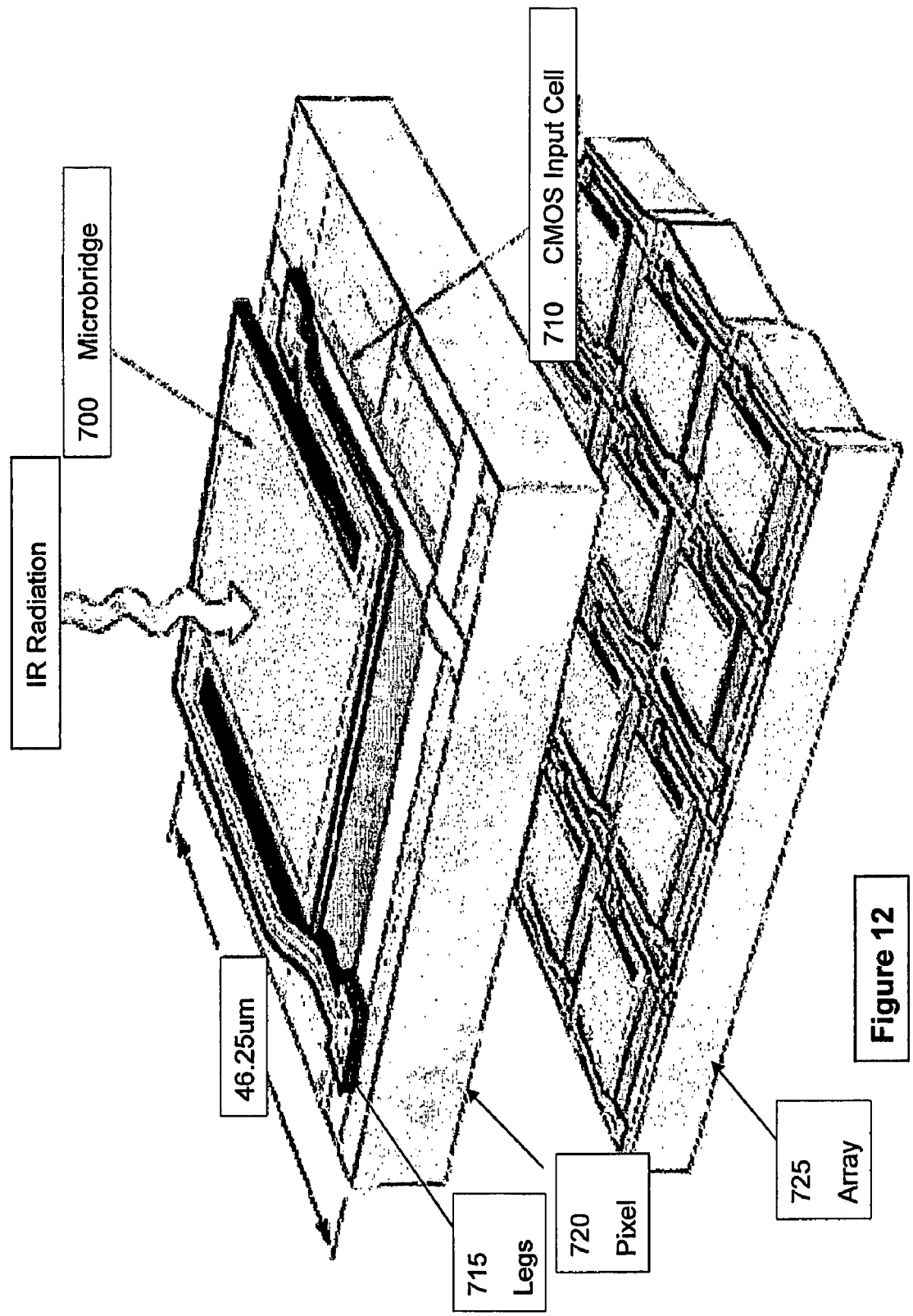
FIG. 12 is a top perspective view of an array of pixels coupled to an ROIC substrate and an exploded view of a single pixel showing the legs that suspend the microbridge portion and electrically couple the microbridge to the substrate.

Referring to FIG. 12, a top view perspective of a device for an embodiment of the present invention is depicted. The microbridge 700 which represents the stack elements that measure IR radiation is suspended above the circuit input cell 710 by vias and coupled to the substrate by a pair of legs 715 that raises the microbridge above the substrate 710. The pixel 720 is shown as an exploded view of the array 725 having multiple pixels with drive circuitry and electrical connections coupling the pixels to the array.

The present invention combines a detailed understanding of the LWIR detection processes and an expertise in optical thin film design for specific applications including extensive knowledge of the optical absorption properties of various materials. As described herein, the present invention includes the concept of adding an absorber layer designed for the MWIR to the LWIR stack that permits the functionality detailed herein.

There are numerous benefits to the present invention including having a viable, laboratory friendly design approach utilizing reliable in-house microbolometer performance models. In addition, the invention is a realization that MWIR and LWIR capability are not mutually exclusive on a single pixel. Furthermore, the silicon foundry capability especially in thin film deposition, etch, and photolithography is already established and easily implemented along with the present design. Thus, the present invention provides a high sensitivity MWIR detector that is cost-effective to manufacture. The fabrication processes as described herein enable devices such that the pixel is selective by changing the absorbing pattern metal on any pixel.

Figure 13:
FIG. 13 shows an IR image from the thermal imaging device of the present invention illustrating the high definition broadband response characteristics.

In one embodiment, the standard LW baseline process was modified to achieve a low cost, production worthy, 320×240 46 μm pitch array that is sensitive in both the medium wave and long wave radiation. In this example, no changes were required either for the ROIC or the electronics. Electrical data shows this array to have a sensitivity of 18 mK in the long wave (7-14 μm) and 261 mK in the medium wave (3-5.0 μm). This uncooled infrared detector was incorporated into a camera and excellent images have been obtained as illustrated in FIG. 13, which shows the high level signal for a hot object, namely a fluid based lighter. The individual holding the lighter is easily recognizable as well. As shown in FIG. 13, the processing easily identifies a person along with a hot object showing the broad capability of the present invention.

The present invention in one of the embodiments dramatically improves the MWIR performance of the uncooled 46 um pitch microbolometer without sacrificing LWIR through a number of steps including adding a thin absorber film for the medium wave; adjusting the gap spacing; modifying film thicknesses, i.e., increasing VOx thickness while lowering dielectric thicknesses; and reducing leg/leg metal widths.

A focal plane array (FPA) Performance Model can be processed using in-house FPA modeling capabilities to calculate the sensitivity of the resultant pixel and to fine tune where necessary as known to those in the art. The design generally requires detector masks for the new configuration and procurement of broad band windows that would pass both medium and long wave signals.

For testing purposes it may be necessary to separate the signals for test by utilizing an appropriate MW or LW filter. The testing is generally performed in order to characterize the experimental FPAs in the MW and in the LW to assess performance.

In order to allow the invention to be adaptable for manufacturability of the MW microbolometer and/or the MW-LW microbolometer, embodiments of the present invention can be manufactured making minimal modifications to the current production microbolometer, using in-house capability to build the array.

In one embodiment the present invention includes the implementation of the Medium Wave Absorber by developing and characterizing the MWIR absorber stack. There are many film modeling programs and general design guides to aid in the design the MWIR stack. For commercial viability, one consideration is the restriction of the design to current processing capabilities.

The structural design of the present invention may involve changing the leg/leg metal dimensions to minimize thermal conductivity to the substrate. The changes of the leg/leg metal parameters confine the changes to a low risk scenario and are within the scope of the invention.

As LWIR processing techniques and designs continue to evolve and improve, these improvements can be transferred to the MWIR, dualband and broadband processing providing additional enhancements of the invention.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A multi-band infrared imaging device, comprising:
   in a single microbridge level, an uncooled microbolometer focal plane array comprising at least plurality of pixels, each of said pixels farther comprising at least one structure layer, a detector layer and a medium wave absorber layer, and wherein each said pixel simultaneously detects at least two IR bands.

2. The device according to claim 1, wherein said array is fabricated by LWIR processing.

3. The device according to claim 1, wherein said bands are selected from the group consisting of: MWIR/LWIR, MWIR/SWIR, SWIR/LWIR, and SWIR/MWIR/LWIR.

4. The device according to claim 1, wherein said structure layer is selected from at least one of the group consisting of: metal films, semiconductor films, and dielectrics.

5. The device according to claim 1, wherein said medium wave absorber layer is selected from at least one of the group consisting of: metal films, semiconductor films, and dielectrics with high MW absorption.

6. An optical stack for an uncooled microbolometer device, comprising:
   in a single microbridge level, a read out integrated circuit (ROIC) substrate;
   a reflector on a surface of said substrate;
   a plurality of layers fabricated by LWIR processing, wherein said plurality of layers include an MWIR absorber, a detector, and at least one structure layer providing support and/or isolation;
   a gap between said reflector and said plurality of layers; and wherein said stack is part of said uncooled microbolometer and detects at least medium wave radiation.

7. The stack according to claim 6, wherein said structure layer is selected from at least one of the group consisting of: metal films, semiconductor films, and dielectrics.

8. The stack according to claim 6, wherein said stack further detects LWIR and/or SWIR.

9. The stack according to claim 6, wherein said structure layer comprises at least one silicon nitride layer and at least one silicon dioxide layer.

10. The stack according to claim 6, wherein said detector is vanadium oxide (VOx) or amorphous silicon.

11. The stack according to claim 6, wherein said MWIR absorber is selected from at least one member of the group consisting of: metal films, semiconductor films, and dielectrics with high MW absorption.

12. The stack according to claim 11, wherein said MWIR absorber is chrome, titanium nitride (TiN) or titanium tungsten (TiW).

13. A multi-spectral infrared (IR) focal plane array, comprising:
   in a single microbridge level, an uncooled microbolometer detecting at least two infrared bands, said microbolometer comprising;
   a generally planar read out integrated circuit substrate base;
   at least one generally planar microbridge disposed approximately parallel to said base and separated by a gap; and wherein each said microbridge comprises a plurality of layers, said layers comprising at least one structural support layer, a detector layer, and selectively a medium wave absorber layer.

14. The array according to claim 13, wherein said array is selectively programmable to at least one of said bands.

15. The array according to claim 13, wherein said array is processed by LWIR techniques.

16. The array according to claim 13, wherein said at least one microbridge forms a two-dimensional array having at least one microbridge without said medium wave absorber layer.

17. The array according to claim 13, wherein said multiple IR bands are selected from the group consisting of: SWIR/MWIR, SWIR/LWIR, MWIR/LWIR, and SWIR/MWIR/LWIR.

18. The device according to claim 13, wherein each said microbridge of said array is arranged in a pattern having at least one said microbridge with said medium wave absorber and least one said microbridge without said medium wave absorber.

19. The array according to claim 13, wherein said medium wave absorber is selectively formed by a pattern etch.

20. The array according to claim 13, wherein at least one microbridge of the array is optimized for one of said bands and at least one microbridge of the array is optimized for one of said bands and at least one microbridge of the array is optimized for a different one of said bands.

* * * * *